(12) United States Patent
Kim et al.

(10) Patent No.: US 7,329,929 B2
(45) Date of Patent: Feb. 12, 2008

(54) SRAM CELL AND METHOD OF MANUFACTURING THE SAME

(75) Inventors: Do Woo Kim, Kyoungki-do (KR); Chang Yeol Lee, Seoul (KR); Myeong Kook Gong, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 334 days.

(21) Appl. No.: 11/106,993

(22) Filed: Apr. 15, 2005

(65) Prior Publication Data

US 2005/0179094 A1    Aug. 18, 2005

Related U.S. Application Data

(62) Division of application No. 10/717,278, filed on Nov. 19, 2003, now Pat. No. 6,902,963.

(30) Foreign Application Priority Data

Jan. 30, 2003    (KR)    ................................. 2003-6167

(51) Int. Cl.
*H01L 29/76*    (2006.01)
*H01L 31/113*    (2006.01)
(52) U.S. Cl. ....................... 257/393; 257/391; 257/392
(58) Field of Classification Search ........ 257/391–393, 257/903, 368

See application file for complete search history.

(56) References Cited

U.S. PATENT DOCUMENTS 6,175,138 B1 *    1/2001    Noda .......................... 257/392

\* cited by examiner

*Primary Examiner*—Theresa T Doan
(74) *Attorney, Agent, or Firm*—Ladas & Parry LLP

(57) ABSTRACT

Disclosed is a SRAM cell and a method of manufacturing the same. The SRAM cell comprises: a pair of access devices; a pair of pull-up devices; a pair of pull-down devices; and at least one metal plate formed on metal interconnection lines in contact with a substrate, having a dielectric film interposed between the metal plate and the metal interconnection lines, so as to increase a cell capacitance, thereby reducing a soft error rate. Herein, one metal plate may be included in each cell. In this case, the metal plate overlaps with a first one of metal interconnection lines of a node side and a node bar side, while being in contact with a second one of the metal interconnection lines of the node side and the node bar side. Also, two metal plates may be included in each cell. In this case, the metal plates overlap, respectively, with one metal interconnection line of metal interconnection lines of a node side and a node bar side, while being in contact with another metal interconnection line of the node side or the node bar side, respectively. Therefore, capacitance is additionally formed to increase cell capacitance, so that variation of the electric potentials of cell nodes, which is caused by generated electrons, is prevented, and thereby soft error can be efficiently reduced.

11 Claims, 10 Drawing Sheets

SRAM CELL AND METHOD OF MANUFACTURING THE SAME

BACKGROUND OF THE INVENTION

1. Field of the Invention

The present invention relates to a static random access memory (SRAM), and more particularly to an SRAM cell which can reduce a soft error rate and a method of manufacturing the same.

2. Description of the Prior Art

An SRAM is a memory device which is driven at a high speed, at a low power, and in a simple manner. The SRAM is advantageous in that a periodical refresh of stored information is not required, unlike a dynamic random access memory (DRAM), and also designing is easy.

Such an SRAM comprises a pair of access devices for cell selection, a pair of pull-down devices functioning as driving devices, a pair of pull-up devices functioning as load devices. Herein, the pull-up devices are classified into three types, that is, a Full CMOS type, a High Load Resistor type, and a Thin Film Transistor type, according to their structure.

FIG. 1 is a circuit diagram of a conventional Full CMOS-type SRAM cell. As shown in FIG. 1, a SRAM cell comprises a cross-coupled pair of inverters, wherein the inverters include a pair of pull-up devices Tp1 and Tp2 each of which is constituted by a PMOS and a pair of pull-down devices Td1 and Td2 each of which is constituted by an NMOS. Access devices Ta1 and Ta2, each of which is constituted by an NMOS and driven selectively according to a signal of a word line WL, are respectively disposed between the drain of a pull-down device Td1 and a bit line BL and between the drain of a pull-down device Td2 and a bit line bar/BL.

In FIG. 1, reference symbol N denotes a node at which an access device Ta1, a pull-up device Tp1, and a pull-down device Td1 are connected in common, and reference symbol NB denotes a node bar at which an access device Ta2, a pull-up device Tp2, and a pull-down device Td2 are connected in common.

Recently, with the improvement of technology and density of a memory cell and the decrease of the operation voltage, the soft error rate has emerged as a hot issue.

The "soft error rate" refers to the discordance between written information and read information in/from a memory cell, that is, a fault caused by information loss. The soft error rate is a concept different from errors caused by a physical defect, and emerges as random Bit fail in a memory cell.

A cause for such soft error may be alpha ($\alpha$) particles emitted from radioactive elements, such as uranium, thorium, and americium. That is, when alpha particles pass a storage area of a cell, charge Up-set is generated to cause electric charge stored in a cell node to be lost. As a result, the actual stored information changes, thus causing soft error.

For example, when alpha particles, which have lost half of their total energy in passing through a protection layer of a chip and thus having an energy of about 4Mev, pass through a storage area, the alpha particles move about 25 $\mu$m. At this time, about $10^6$ electron-hole pairs (EHPs) are generated, which are an amount of electric charge sufficient to cause a soft error.

Actually, alpha particles existing in epoxy molding compound (EMC) and so forth collide with silicon nuclei, thus making energetic silicon nuclei, and this energy permits carriers (EHP) connected with silicon nuclei to become free carriers. Among these free carriers, holes are recombined in a p-well and are annihilated, while electrons pass a diffusion and drift area, arrive at a cell node, and then change the electric charge distribution of the cell node. Therefore, node voltage is varied, so that soft error is caused.

Such soft errors have actually emerged as a big problem in SRAM cells, and a number of studies have been made to solve this problem.

SUMMARY OF THE INVENTION

Accordingly, the present invention has been made to solve the above-mentioned problems occurring in the prior art, and an object of the present invention is to provide an SRAM cell which can efficiently reduce the soft error rate and a method of manufacturing the same.

Also, another object of the present invention is to provide an SRAM cell and a method of manufacturing the same, in which the SRAM cell can improve the characteristic of a device by efficiently reducing the soft error rate.

In order to accomplish these objects, there is provided a SRAM cell comprising: a pair of access devices; a pair of pull-up devices; a pair of pull-down devices; and at least one metal plate formed on metal interconnection lines in contact with a substrate, having a dielectric film interposed between the metal plate and the metal interconnection lines, so as to increase a cell capacitance, thereby reducing a soft error rate.

Herein, one metal plate may be included in each cell. In this case, the metal plate overlaps with a first one of a metal interconnection line of a node side and a metal interconnection line of a node bar side, while being in contact with a second one of the metal interconnection line of the node side and the metal interconnection line of the node bar side.

Also, two metal plates may be included in each cell. In this case, the metal plates overlap, respectively, with one metal interconnection line different from each other of a metal interconnection line of a node side and a metal interconnection line of a node bar side, while being in contact with another metal interconnection line of the node side or the node bar side which are opposite to the contacted metal interconnection line, respectively.

In accordance with another aspect of the present invention, there is provided a method of manufacturing an SRAM cell, the method comprising the steps of: (1) forming a gate on a semiconductor substrate having an isolation layer; (2) depositing an interlayer insulating film on the substrate so as to cover the gate; (3) etching the interlayer insulating film to form contact holes which expose the gate and the substrate, respectively; (4) filling each of the holes with a conductive film to form contact plugs; (5) sequentially depositing an etching barrier film and an insulating oxide film on the interlayer insulating film including the contact plugs; (6) etching the insulating oxide film and the etching barrier film to form trenches of predetermined shapes which expose respective contact plugs; (7) filling each of the trenches with a metal film to form metal interconnection lines; (8) depositing a dielectric film on the insulating oxide film including the metal interconnection lines; (9) etching the dielectric film to expose at least one specified metal interconnection line; and (10) forming a metal plate so that the metal plate is in contact with the metal interconnection line exposed out of the dielectric film.

Herein, the contact plug is a tungsten plug including a barrier metal film.

The dielectric film comprises either an oxide film made from an oxide selected from the group consisting of Plasma Enhanced-Tetra Ethyl Ortho Silicate (PE-TEOS), High Temperature Oxide (HTO), and Middle Temperature Oxide (MTO) or a nitride film made from a nitride such as $Si_3N_4$, and the deposited dielectric film has a thickness of 200~600 Å.

Step (9) is performed under a condition in which surface loss of the metal interconnection line caused by over-etching is maintained less than 500 Å.

The metal plate is made from one material selected from the group consisting of Ti, TiN, and Ti/TiN, and the formed metal plate has a thickness of 100~500 Å.

Step (9) is performed so that one of a metal interconnection line of a node side and a metal interconnection line of a node bar side is exposed. In this case, one metal plate is formed in each cell, the metal plate being in contact with an exposed metal interconnection line of the metal interconnection lines of the node side and the node bar side, the metal overlapping with another metal interconnection line of the node bar side or the node side which are opposite to the contacted metal interconnection line.

Step (9) is performed so that both a metal interconnection line of a node side and a metal interconnection line of a node bar side are exposed. In this case, two metal plates are formed in each cell, two metal plates being in contact with the exposed metal interconnection lines of the node side and the node bar side respectively, each metal plate overlapping with the metal interconnection line of the node side or the node bar side which are opposite to the contacted metal interconnection line, respectively.

According to the present invention, capacitance is additionally formed to increase cell capacitance, so that variation of the electric potentials of cell nodes, which is caused by generated electrons, is prevented, and thereby soft error can be efficiently reduced.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
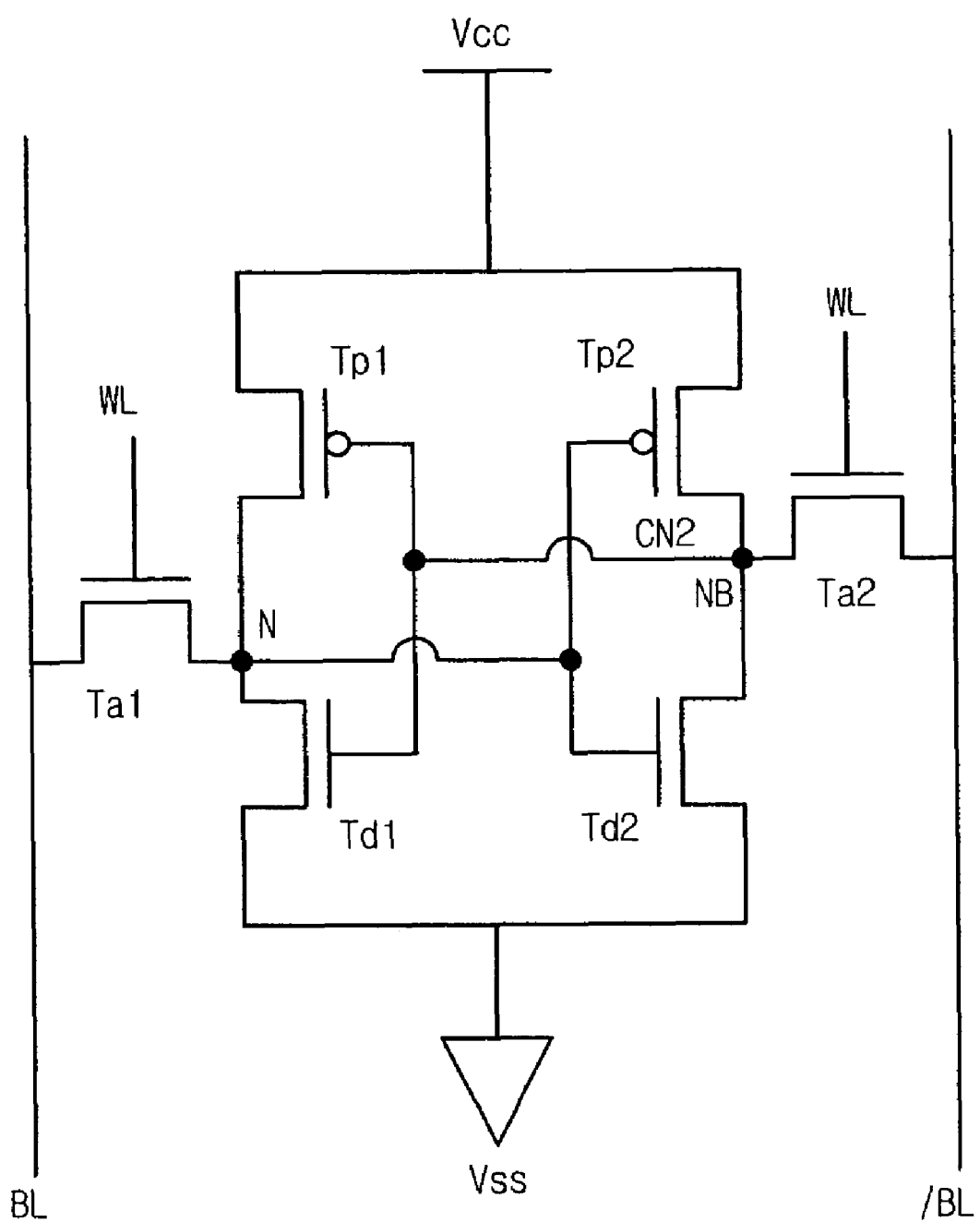
FIG. 1 is a circuit diagram of a conventional SRAM cell.

Hereinafter, a preferred embodiment of the present invention will be described in detail.

The soft error in a SRAM, as described above, is caused by variation of a node voltage which is generated so that electrons having arrived at a cell node change the electric charge distribution of the cell node. If the amount of electric charge in a cell node, which may vary the node voltage, is increased, the variation of a node voltage caused by electrons having arrived at the cell node is inhibited, and thereby soft error can be efficiently reduced.

Therefore, in the present invention, cell capacitance is increased to increase the amount of electric charge in a cell node, so that undesired variation of a node voltage caused by electrons having arrived at the cell node is prevented and thereby the soft error rate is reduced. To this end, in the present invention, after metal interconnection lines are formed, a dielectric film and a metal plate are formed, and thereby additional capacitance is formed in each cell.

As a result, an SRAM cell according to the present invention includes at least a cell capacitor constituted additionally to increase cell capacitance as well as a pair of access devices, a pair of pull-down devices, and a pair of pull-up devices.

Hereinafter, a SRAM cell and a method of manufacturing the same according the the present invention will be described in more detail with reference to the accompanying drawings. In the following description and drawings, the same reference numerals are used to designate the same or similar components, and so repetition of the description on the same or similar components will be omitted.

Figure 2:
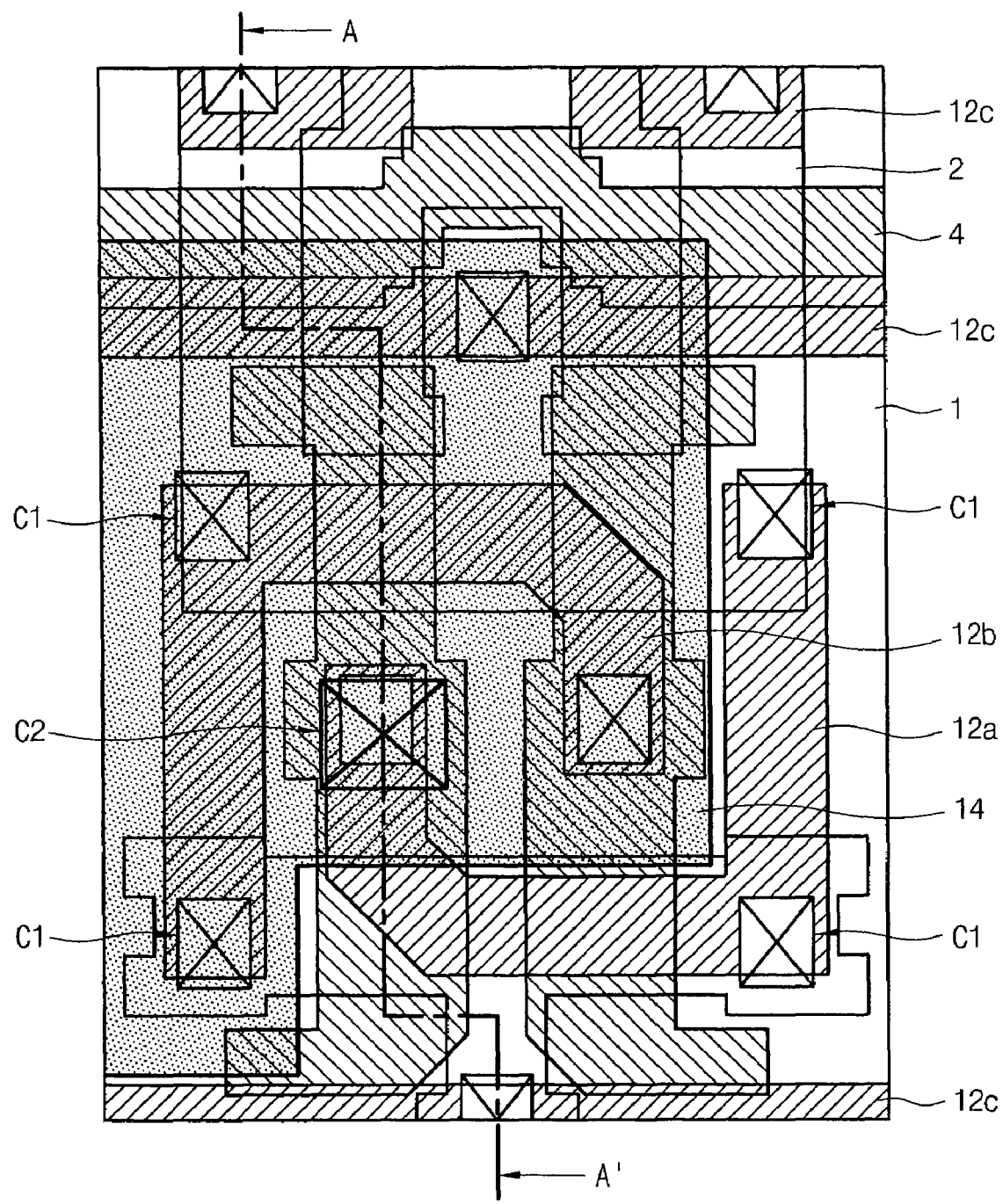
FIG. 2 is a layout view of an SRAM cell according to a first embodiment of the present invention.

FIG. 2 is a layout view of an SRAM cell according to a first embodiment of the present invention. An SRAM cell according to the present invention includes a pair of access devices, a pair of pull-down devices, and a pair of pull-up devices, although they are not shown in detail in the drawing and, more particularly, further includes a metal plate 14. The metal plate 14, for example, cooperates with a metal interconnection line 12b of the node bar side below the metal plate 14 to constitute a capacitor, and is in contact with a metal interconnection line 12a of the node side. Also, it may be understood that the metal plate 14 is in contact with a metal interconnection line 12b of the node bar side while the metal plate 14 cooperates with a metal interconnection line 12a of the node side to constitute a capacitor.

With such a layout, cell capacitance is increased by an additionally constituted capacitor, so that the variation of the node voltage caused by electrons having arrived at the cell node is inhibited, and thereby the soft error rate can be reduced.

In FIG. 2, reference number 1 denotes a substrate, reference number 2 denotes an isolation layer, reference number 4 denotes a gate, reference number 8 denotes a tungsten plug, reference symbol C1 denotes a contact portion of a metal interconnection line, and reference symbol C2 denotes a contact portion of a capacitor.

FIGS. 3A to 3E are cross-sectional views taken along the A-A' line in FIG. 2 so as to show each process of a method of manufacturing an SRAM cell according to the first embodiment of the present invention, and FIGS. 4A to 4F are plane views of each element in an SRAM cell according to the first embodiment of the present invention.

Referring to FIG. 3A and FIGS. 4A to 4C, trench-shape isolation layers 2 are formed at appropriate positions of a semiconductor substrate 1, according to a conventional shallow trench isolation (STI) process. Then, a gate 4 is formed on the substrate 1 including the isolation layer 2 by a poly process. A, drift implant process, a gate spacer forming process, and a source/drain implant process are sequentially preformed to form source/drain regions (not shown) including a drift region inside of the surface of substrate at both sides of the gate 4.

Next, a nitride film 5 and an interlayer insulating film 6 are sequentially deposited on the whole area of the substrate 1 including the source/drain region and the gate 4. The interlayer insulating film 6 and the nitride film 5 are etched to form first contact holes C1 each of which exposes the gate and the source/drain region. A barrier metal film 7 and a tungsten film are sequentially deposited in each of the first contact holes C1, and then the entire surface of these is etched to form tungsten plugs 8.

Figure 3A:
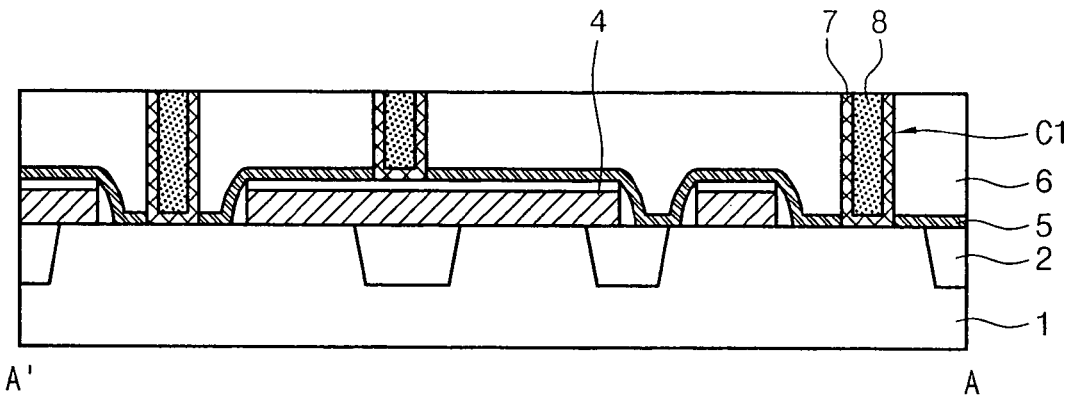
FIGS. 3A to 3E are cross-sectional views taken along the A-A' line in FIG. 2 so as to show each process of a method of manufacturing an SRAM cell according to the first embodiment of the present invention.
Figure 3B:
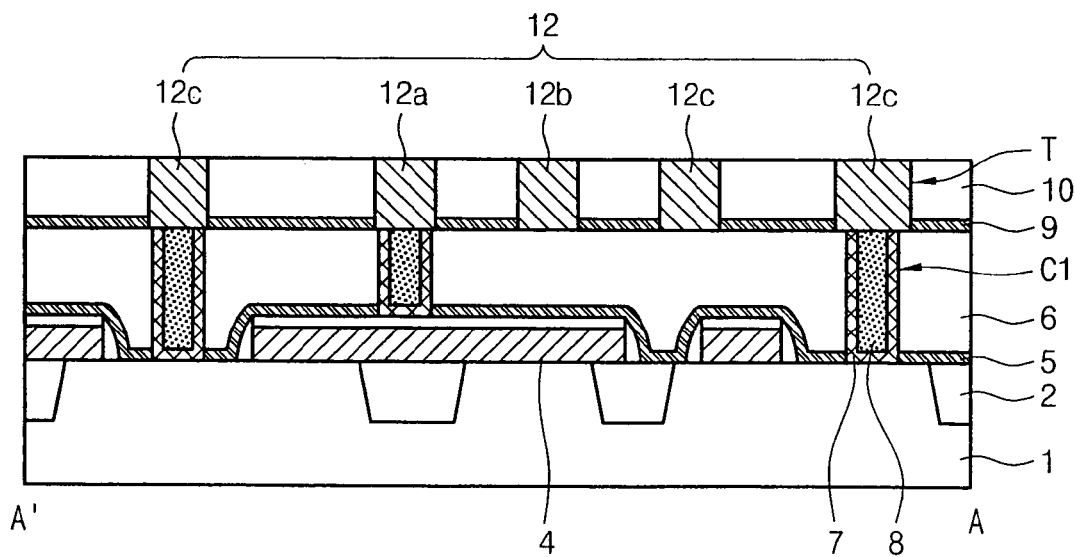
Figure 4A:
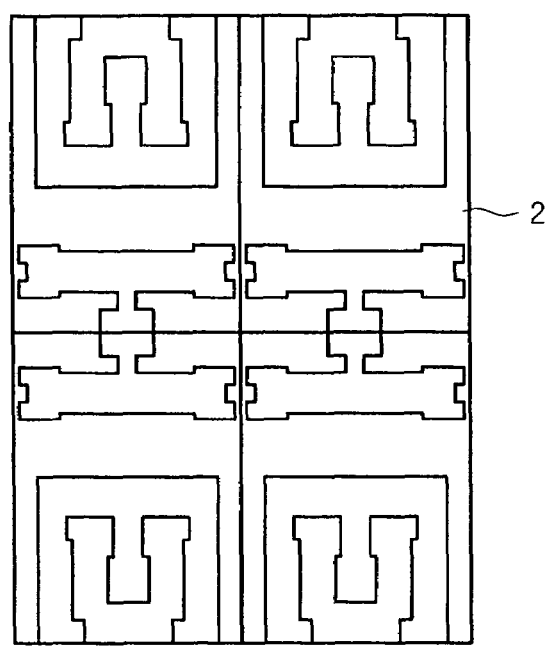
FIGS. 4A to 4F are plane views of each element in an SRAM cell according to the first embodiment of the present invention.
Figure 4B:
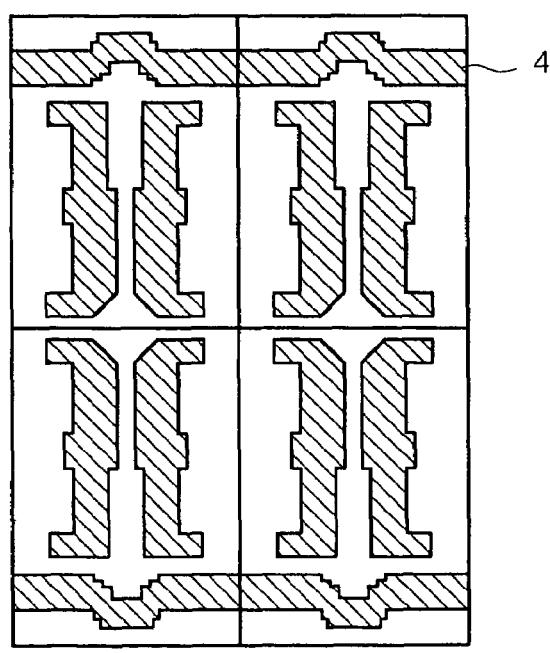
Figure 4C:
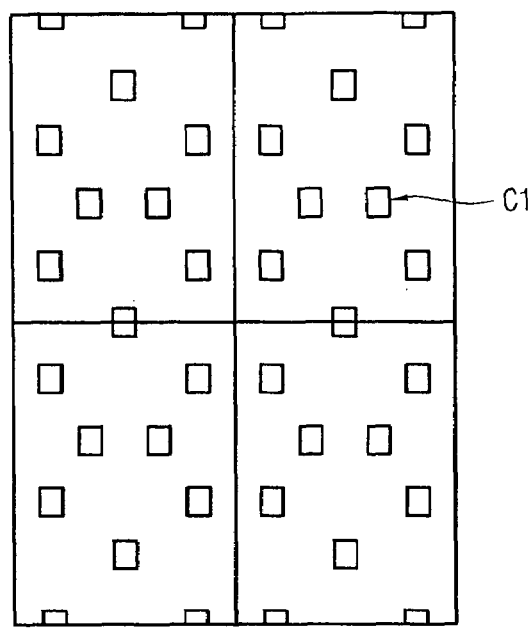
Figure 4D:
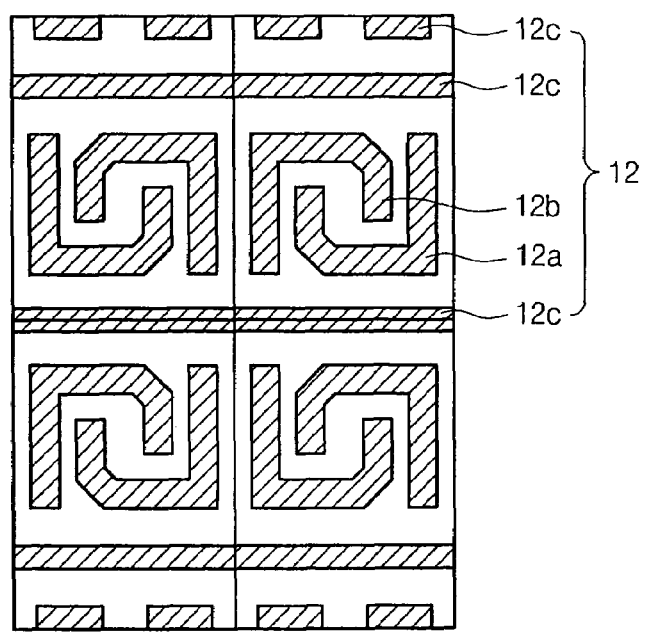

Referring to FIGS. 3B and 4D, a first etching barrier film 9 and a first insulating oxide film 10 are sequentially deposited on the interlayer insulating film 6 including the tungsten plugs 8. Preferably, the first etching barrier film 9 is a nitride film. The first insulating oxide film 10 and the first etching barrier film 9 are etched using a high etching selectivity between a nitride film and an oxide film, and thereby trenches T of predetermined shapes exposing the tungsten plugs 8 are formed.

A tungsten film is thickly deposited on the first insulating oxide film 10 so that the trenches T are filled, and then a chemical mechanical polishing (CMP) process is performed to the resultant substrate, so that metal interconnection lines 12 are formed. The metal interconnection lines 12 are in contact with a part of the substrate, preferably, with the source/drain region through the tungsten plugs 8. The metal interconnection lines 12 are divided into metal interconnection lines 12a and 12b of the node side and the node bar side and metal interconnection lines 12c in contact with the substrate, according to positions at which the metal interconnection line is formed.

Figure 3C:
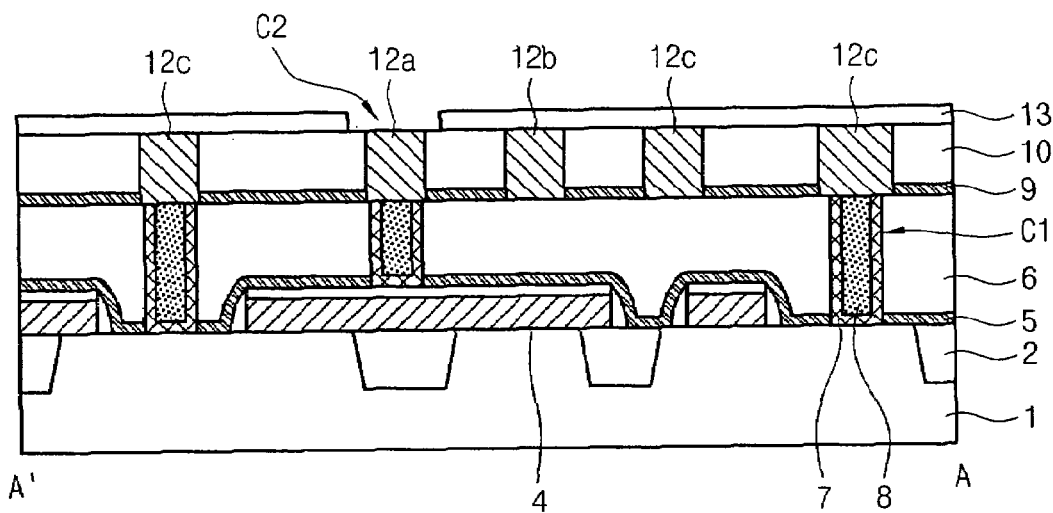
Figure 4E:
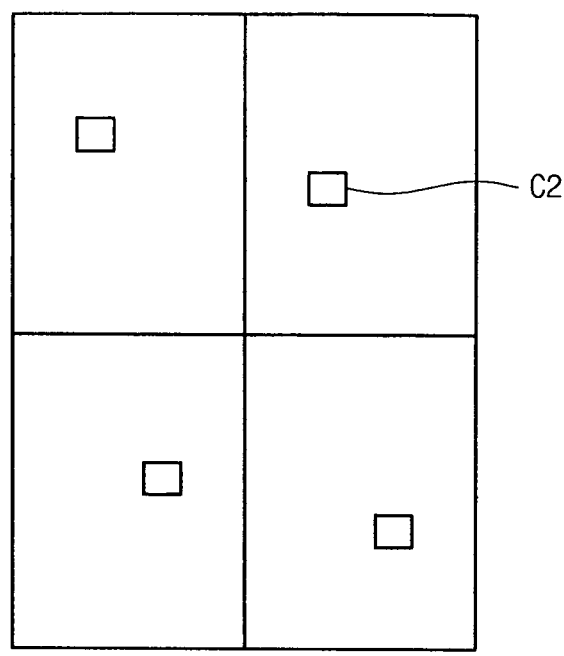

Referring to FIGS. 3C and 4E, a dielectric film 13 is deposited on the first insulating oxide film 10 including the metal interconnection lines 12. Preferably, the dielectric film 13 may be an oxide film made from an oxide such as PE-TEOS, HTO, or MTO. Otherwise, the dielectric film 13 may be a nitride film made from a nitride such as $Si_3N_4$. The deposited dielectric film 13 has a thickness of 200~600 Å. The dielectric film 13 is etched to form a second contact hole C2 which exposes a part, preferably a top face, of the metal interconnection line 12a of the node side. Herein, the etching of the dielectric film 13 is performed under a condition in which surface loss of the metal interconnection line 12a caused by over-etching is less than 500 Å.

Figure 3D:
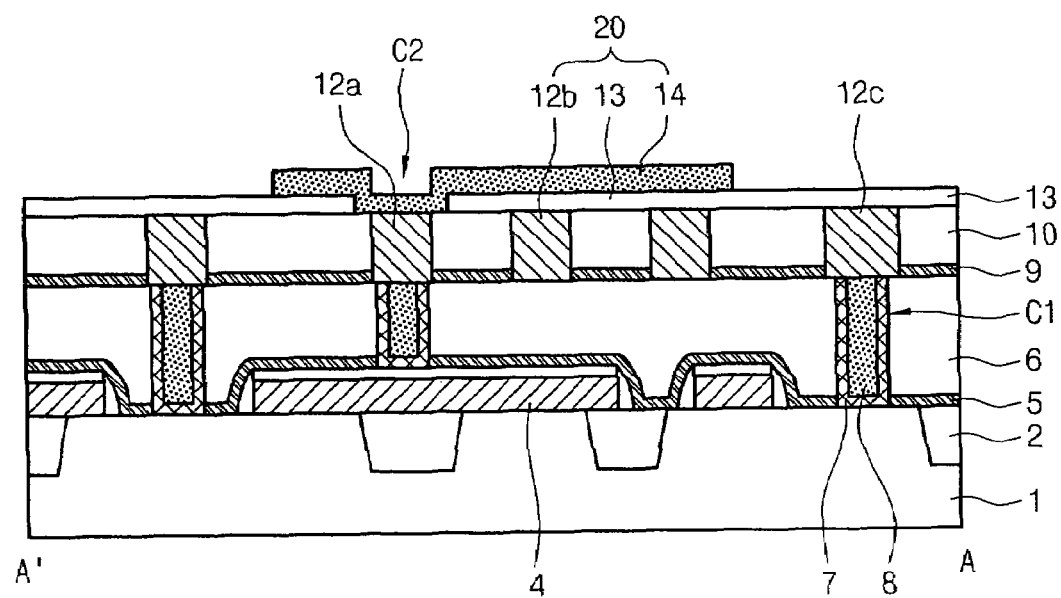
Figure 4F:
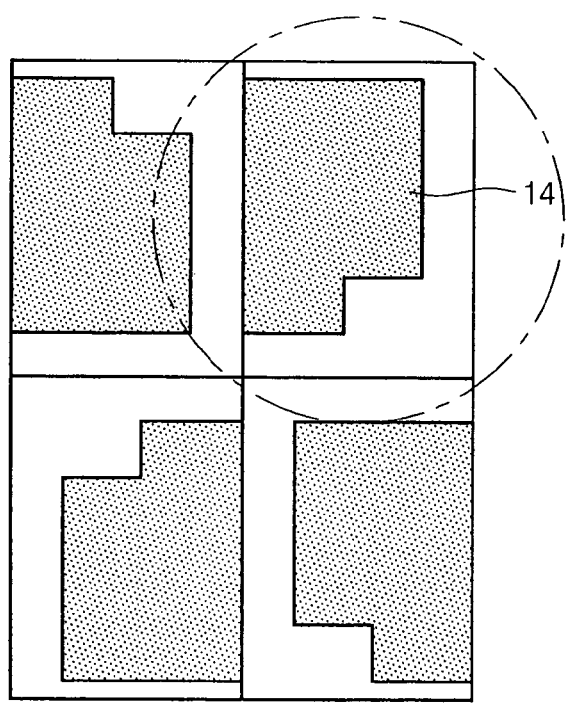

Referring to FIGS. 3D and 4F, a metal film made from a metal such as Ti, TiN, or Ti/TiN is deposited on the dielectric film 13 and an exposed portion of the metal interconnection line of the node side to a thickness of 100~500 Å. Then, the metal film is etched to form a metal plate 14 in contact with the exposed metal interconnection line 12a of the node side, so that a capacitor 20 comprising the metal interconnection line 12b of the node bar side, the dielectric film 13, and the metal plate 14 is constituted.

Figure 3E:
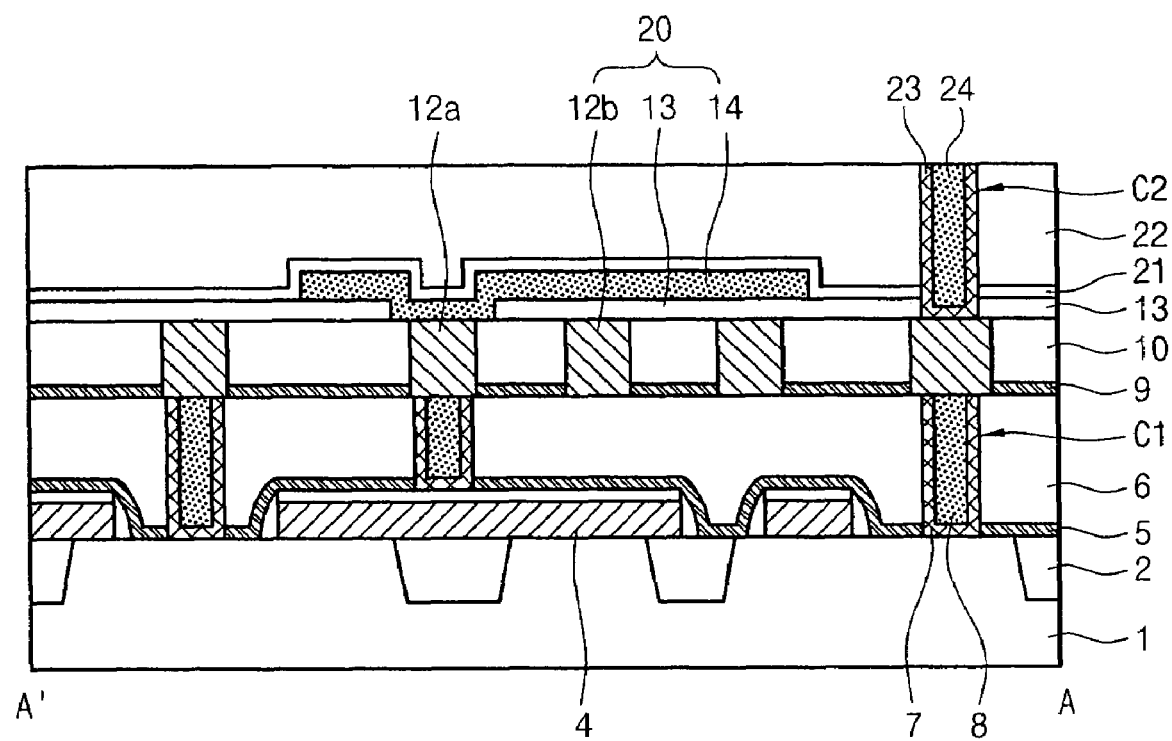

Referring to FIG. 3E, a second etching barrier film 21 and a second insulating oxide film 22 are sequentially deposited on the resultant substrate. The second insulating oxide film 22 and the second etching barrier film 21 are etched to form a third contact hole C3 which exposes the metal interconnection line 12c in contact with the substrate 1. Subsequently, after a barrier metal film and a tungsten film are sequentially deposited, they are totally etched to form a tungsten plug 24 including a barrier metal film 23 in the third contact hole C3.

Thereafter, deposition processes of an etching barrier film and an insulating oxide film, an etching process of these, and a tungsten plug forming process are repeatedly performed to form a third-layer or a fourth-layer metal interconnection line, and thereby an SRAM cell according to the present invention is formed.

According to the present invention described above, since a metal plate is additionally formed after metal interconnection lines are formed, a capacitor can be constituted either between the metal interconnection line of the node side and the metal plate or the metal interconnection line of the node bar side and the metal plate.

Accordingly, an SRAM cell according to the present invention has an increased cell capacitance, so that a phenomenon, that the electric potentials of cell nodes varies by electrons of electron-hole pairs (EHPs) generated by alpha particles, and thereby soft error can be efficiently reduced.

Meanwhile, In a method of manufacturing an SRAM cell according to the above-mentioned present invention, it is preferred that the total thickness of the dielectric film and the metal plate is less than 1000 Å so that an additional planarization process is not performed in a following process.

Figure 5:
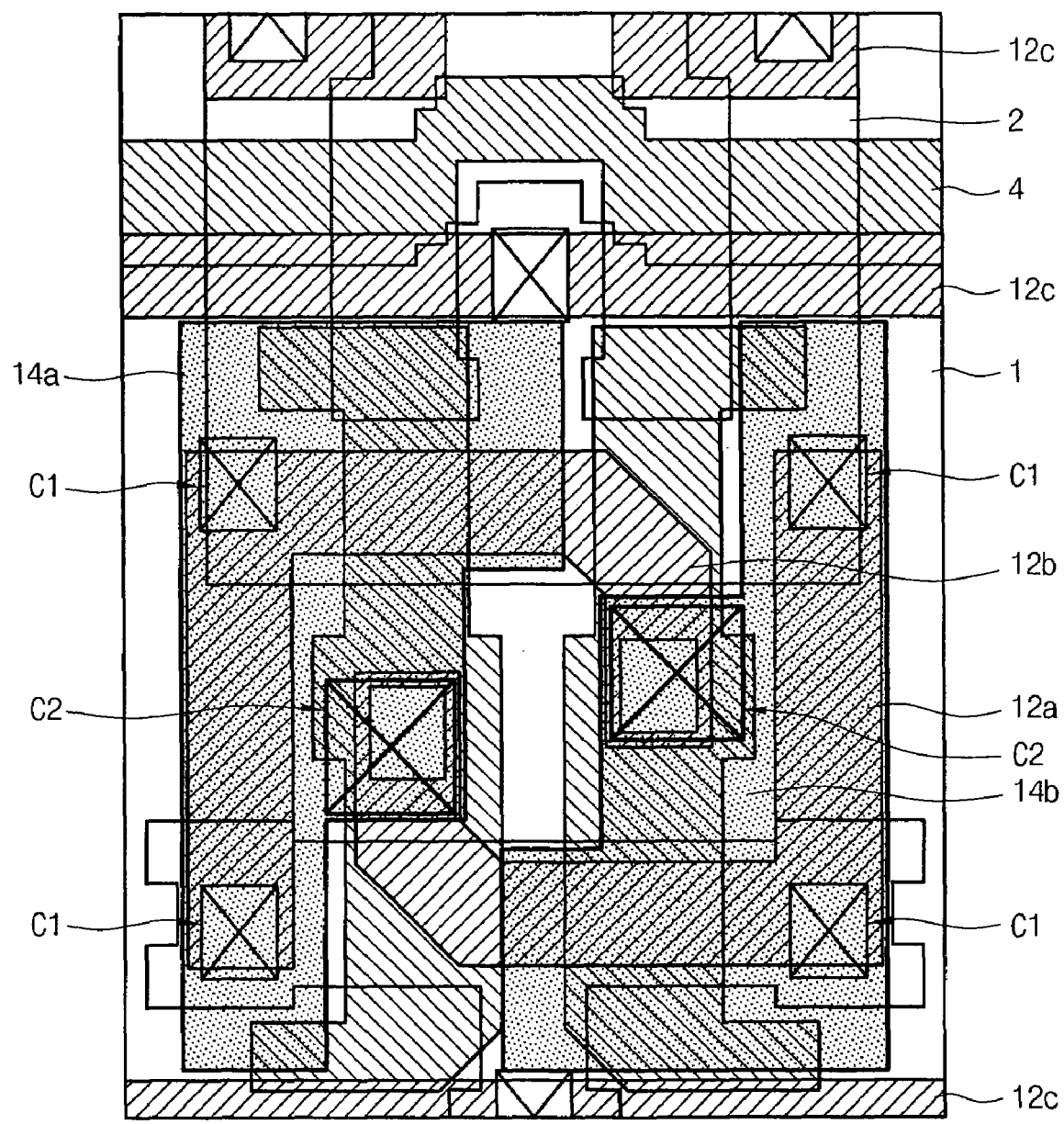
FIG. 5 a layout view of an SRAM cell according to a second embodiment of the present invention.
Figure 6A:
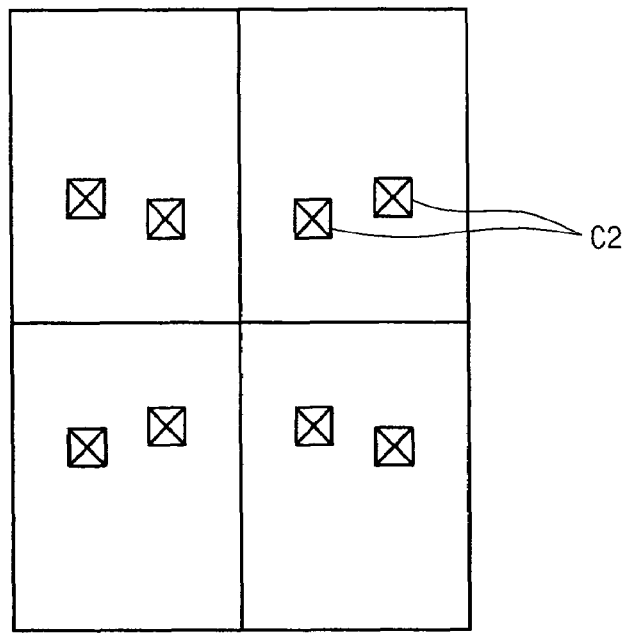
FIGS. 6A and 6B are plane views illustrating capacitor contact and metal plates respectively in an SRAM cell according to the second embodiment of the present invention.
Figure 6B:
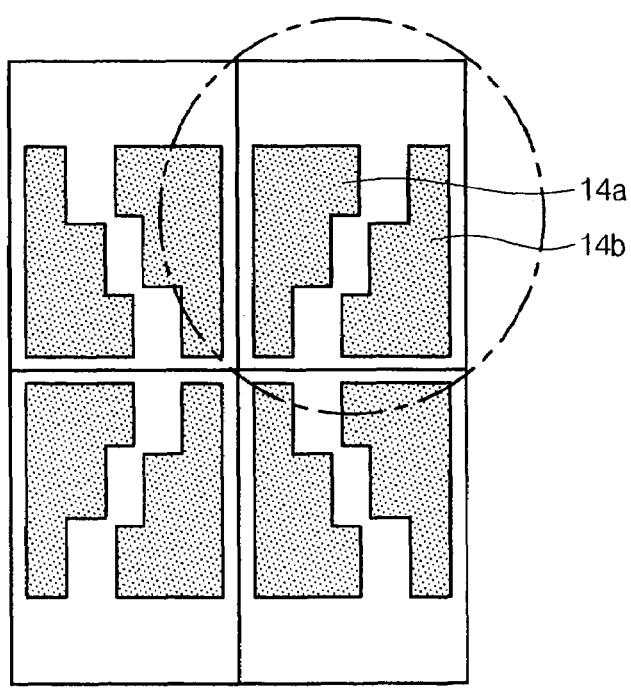

FIG. 5 a layout view of an SRAM cell according to a second embodiment of the present invention, and FIGS. 6A and 6B are plane views illustrating capacitor contact and metal plates respectively in an SRAM cell according to the second embodiment of the present invention.

As shown in these drawings, an SRAM cell according to the second embodiment of the present invention, unlike the first embodiment of including only one metal plate in the cell, comprises two metal plates 14a and 14b in the cell. In this case, a first metal plate 14a of the two metal plates 14a and 14b is formed so as to overlap with the metal interconnection line 12b of the node bar side and to be in contact with the metal interconnection line 12a of the node side, and a second metal plate 14b is formed so as to overlap with the metal interconnection line 12a of the node side and to be in contact with the, metal interconnection line 12b of the node bar side.

With the second embodiment of the present invention, since the SRAM cell comprises two metal plates, a cell capacitance more increased than that in an SRAM cell according to the first embodiment can be obtained, and thereby the soft error rate is further reduced.

According to the present invention as described above, after metal interconnection lines are formed, at least one metal plate is formed in each cell to constitute a capacitor, so that a cell capacitance is increased; and thereby the soft error rate in an SRAM cell can be efficiently reduced. Accordingly, the characteristic of an SRAM can be improved.

Also, according to the present invention, it is possible to provide a technical foundation for reduction of cell size and manufacture of a high-density pull CMOS. SRAM, which will contribute to improving the characteristic and the reliability of a device according to the advance of high integration of a device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:
1. A SRAM cell comprising:
a first access device;
a second access device;
a first pull-up/pull-down configuration having equipotential gates at a first potential driven by the second access device;
a second pull-up/pull-down configuration having equipotential gates at a second potential driven by the first access device;

a first metal interconnection line operatively coupling together the first access device and the equipotential gates of the second pull-up/pull-down configuration;

a second metal interconnection line operatively coupling together the second access device and the equipotential gates of the first pull-up/pull-down configuration, wherein the first and second access devices, the first and second pull-up/pull-down configurations, and the first and second metal interconnection lines constitutes an SRAM device;

a dielectric film overlain on top of the SRAM device;

a first contact plug operatively coupled to the first metal interconnection line and traversing through the dielectric film;

a first metal plate operatively coupled to the first contact plug and overlain on top of the dielectric film, wherein the first metal plate, a portion of the dielectric film and a portion of the second metal interconnection line comprising a first shielding capacitor, wherein the SRAM device and the first shielding capacitor constitutes the SRAM cell, whereby the first shielding capacitor increases the SRAM cell capacitance, thereby reducing a soft error rate.

2. The SRAM cell of claim 1, wherein the SRAM cell having only the first metal plate.

3. The SRAM cell of claim 2, wherein the first metal plate overlaps all portions of the second metal interconnection line.

4. The SRAM cell of claim 1, further comprising:

a second contact plug operatively coupled to the second metal interconnection line and traversing through the dielectric film;

a second metal plate operatively coupled to the second contact plug and overlain on top of the dielectric film, wherein the second metal plate, a portion of the dielectric film and a portion of the first metal interconnection line comprising a second shielding capacitor, wherein the SRAM device and the first and second shielding capacitors constitutes the SRAM cell, whereby the first and second shielding capacitors increases the SRAM cell capacitance, thereby reducing the soft error rate.

5. The SRAM cell of claim 4, wherein the metal plates overlap, respectively, with one metal interconnection line different from each other of a metal interconnection line of a node side and a metal interconnection line of a node bar side, while being in contact with another metal interconnection line of the node side or the node bar side which are opposite to the contacted metal interconnection line, respectively first metal plate overlaps a portion of the second metal interconnection line along a node side, and the second metal plate overlaps a portion of the first metal interconnection line along a node bar side.

6. The SRAM device of claim 1 wherein the first and second contact plugs are composed of tungsten.

7. The SRAM cell of claim 6 wherein the second metal plate is selected from the group consisting of Ti, TiN, and Ti/TiN.

8. The SRAM cell of claim 6 wherein the second shielding capacitor having an absolute value voltage drop approximating a difference between the first and second potentials at the equipotential gates of the first and second pull-up/pull down configurations, respectively.

9. The SRAM cell of claim 1 wherein the dielectric film is selected from the group consisting of silicon nitride, Plasma Enhanced-Tetra-Ethyl-Ortho-Silicate (PE-TEOS), High Temperature Oxide (HTO), and Middle Temperature Oxide (MTO).

10. The SRAM cell of claim 1 wherein the first metal plate is selected from the group consisting of Ti, TiN, and Ti/TiN.

11. The SRAM cell of claim 1 wherein the first shielding capacitor having an absolute value voltage drop approximating a difference between the first and second potentials at the equipotential gates of the first and second pull-up/pull down configurations, respectively.

* * * * *